(12) United States Patent
Chen et al.

(10) Patent No.: US 6,784,107 B1
(45) Date of Patent: Aug. 31, 2004

(54) METHOD FOR PLANARIZING A COPPER INTERCONNECT STRUCTURE

(76) Inventors: Hui Chen, 755 E. Capitol Ave. #K201, Milpitas, CA (US) 95035; Chun Yan, 6066 Elmbridge Dr., San Jose, CA (US) 95129; Wai-Fan Yau, 388 Alvarado Ave., Los Altos, CA (US) 94022

( * ) Notice: Subject to any disclaimer, the term of this patent is extended or adjusted under 35 U.S.C. 154(b) by 0 days.

(21) Appl. No.: 10/391,325

(22) Filed: Mar. 18, 2003

(51) Int. Cl.[7] .................. H01L 21/302; G06F 19/00
(52) U.S. Cl. ............................ 438/689; 700/121
(58) Field of Search ........................ 438/689, 754, 438/637, 597, 125, 704, 761, 763, 780; 216/106, 92, 63, 20; 700/121

(56) References Cited

U.S. PATENT DOCUMENTS

| | | | |
|---|---|---|---|
| 4,311,551 A | 1/1982 | Sykes | 156/640 |
| 4,695,348 A | 9/1987 | Battey et al. | 156/647 |
| 4,859,281 A | 8/1989 | Goltz | 156/666 |
| 5,127,991 A | 7/1992 | Lal et al. | 156/659.1 |
| 6,146,606 A | 11/2000 | Atobe et al. | 423/239.1 |
| 6,383,907 B1 * | 5/2002 | Hasegawa et al. | 438/597 |
| 6,541,391 B2 | 4/2003 | Smith et al. | 438/754 |

* cited by examiner

*Primary Examiner*—Evan Pert
*Assistant Examiner*—Monica D. Harrison
(74) *Attorney, Agent, or Firm*—Hoser, Patterson & Sheridan; Joseph Bach

(57) ABSTRACT

A method of planarizing a copper interconnect structure using an atomic layer removal (ALR) technique to planarize a copper layer. In one embodiment, the ALR process performs a plurality of cycles, each cycle having a period of forming a film of copper fluoride on the copper layer and a period of removing the film of copper fluoride. The ALR process is repeated until a barrier layer beneath the copper layer is then etched to expose a dielectric material. The remaining copper forms a conductive line that is substantially coplanar with the dielectric material.

21 Claims, 7 Drawing Sheets

METHOD FOR PLANARIZING A COPPER INTERCONNECT STRUCTURE

BACKGROUND OF THE INVENTION

1. Field of the Invention

The present invention generally relates to semiconductor substrate processing systems. More specifically, the present invention relates to a method for planarizing a copper interconnect structure in a semiconductor substrate processing system.

2. Description of the Related Art

In the semiconductor industry, much effort is spent in developing smaller integrated circuit (IC) devices with ever-increasing operating speed. Among of the factors affecting the operating speed of the IC devices are circuit density and a value of the dielectric constant of an inter-metal dielectric (IMD) layer in a wiring network of the IC device. To increase the circuit density, a dual damascene technique is used during fabrication of the IC devices, and, to increase the operating speed, the IMD layers are formed using materials having a dielectric constant less than 4 (i.e., less than a dielectric constant of silicon dioxide ($SiO_2$)). Such materials are commonly referred to as low-K materials. The low-K materials comprise carbon-doped dielectrics, such as organic doped silicon glass (OSG), organic polymers (e.g., benzocyclobutene, parylene, polytetrafluoroethylene, polyether, polyimide), and the like.

The IC device comprises a plurality of wiring layers formed from conductive lines that are separated from each other and from a substrate (e.g., silicon (Si) wafer) by the IMD layers. The dual damascene technique includes forming an insulator layer (e.g., IMD layer) on the substrate. In an IMD layer, trenches and openings are etched to position the conductive lines and contact holes, or vias. Then, a barrier layer (e.g., layer comprising tantalum (Ta) and tantalum nitride (TaN) films) and a metal layer (e.g., copper (Cu) layer) are sequentially deposited upon the IMD layer to form a conductive interconnect structure. The barrier layer improves adhesion between the low-K IMD layer (e.g., OSG layer) and the copper, as well as impedes diffusion of copper and oxygen into the low-K material. The copper fills (metallizes) the trenches and openings in the IMD layer, thus forming conductive lines and vias, respectively. After metallization, the IMD layer should be planarized. During a planarization process, the excess metal and the underlying barrier layer are removed and conductive lines and vias are formed in the IMD layer. The conductive lines and vias are embedded in the IMD layer coplanar with an exposed surface of the layer such that the next wiring layer may be formed on top of the IMD layer.

In the prior art, such excess copper and the underlying barrier layer are removed from the surface of the IMD layer using chemical-mechanical polishing (CMP) process. During the CMP process, material above a feature such as a trench is removed at a higher rate than in other areas resulting in a concave cross-sectional pattern (or dishing) of the metallization. A depth of the concave pattern generally is in a range between 200 and 500 Angstroms. Compressive and rotational forces applied to a surface of the IMD layer during the CMP process may also cause erosion, as well as cracking and peeling, of the dielectric material in the IMD layer.

The thinned copper and barrier layers in the portion near the edge of the substrate are removed using an etchback process. However, the etchback process of the prior art can remove only very thin films of copper, e.g., films having a thickness of about 50 Å Angstroms. Such etchback process quickly self-terminates as a result of forming a continuous film of non-volatile copper fluoride (CuF) residue over the copper layer on the substrate. The residue isolates the remaining material layer of copper from the etchant gas, and the etchback process stops.

Therefore, there is a need in the art for an improved method of planarizing a copper interconnect structure during fabrication of the IC devices.

SUMMARY OF THE INVENTION

The present invention is a method of planarizing a copper interconnect structure using an atomic layer removal (ALR) technique to planarize a copper (Cu) layer. In one embodiment, the ALR process performs a plurality of cycles, each cycle having a period of exposing a layer of copper to a gas to form a layer of copper fluoride (CuF) on the copper layer and a period of removing the layer of copper fluoride.

The ALR process is repeated until a barrier layer beneath the copper layer is exposed. Then the barrier layer is etched to expose a layer of a dielectric material. The copper interconnect structure is now planarized such that a surface of the remaining copper layer is substantially coplanar with a surface of the layer of the dielectric material (i.e., IMD).

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted that the appended drawings illustrate only exemplary embodiments of this invention and are therefore not to be considered limiting of its scope, for the invention may admit to other equally effective embodiments.

DETAILED DESCRIPTION

The present invention is a method of planarizing a copper interconnect structure. During a metallization process (e.g., an electroplating process), copper fills trenches and via openings in an inter-metal dielectric (IMD) layer, as well as covers other regions on a semiconductor substrate, e.g., a silicon (Si) wafer. Herein the terms "substrate" and "wafer" are used interchangeably. A copper layer is applied to a barrier layer, which is deposited on the IMD layer prior to the copper metallization process.

The barrier layer is used to protect material of the IMD layer (e.g., material having a dielectric constant less than 4 and herein referred to as low-K material), as well as to improve adhesion between the copper and such material. Generally, the barrier layer comprises at least one film of a metal (e.g., Ta, Ti, and the like) and at least one film of a nitride of the metal, i.e., TaN, TiN, and the like, respectively.

After the metallization process, the copper interconnect structure is planarized, so the next wiring layer of the IC device can be fabricated upon that IMD layer. After the planarizing process, the copper-filled trenches (conductive lines) and contact holes (vias) are embedded into the IMD layer coplanar with a surface of the IMD layer, while the copper and barrier layers are removed above the plane of the IMD layer.

Figure 1:
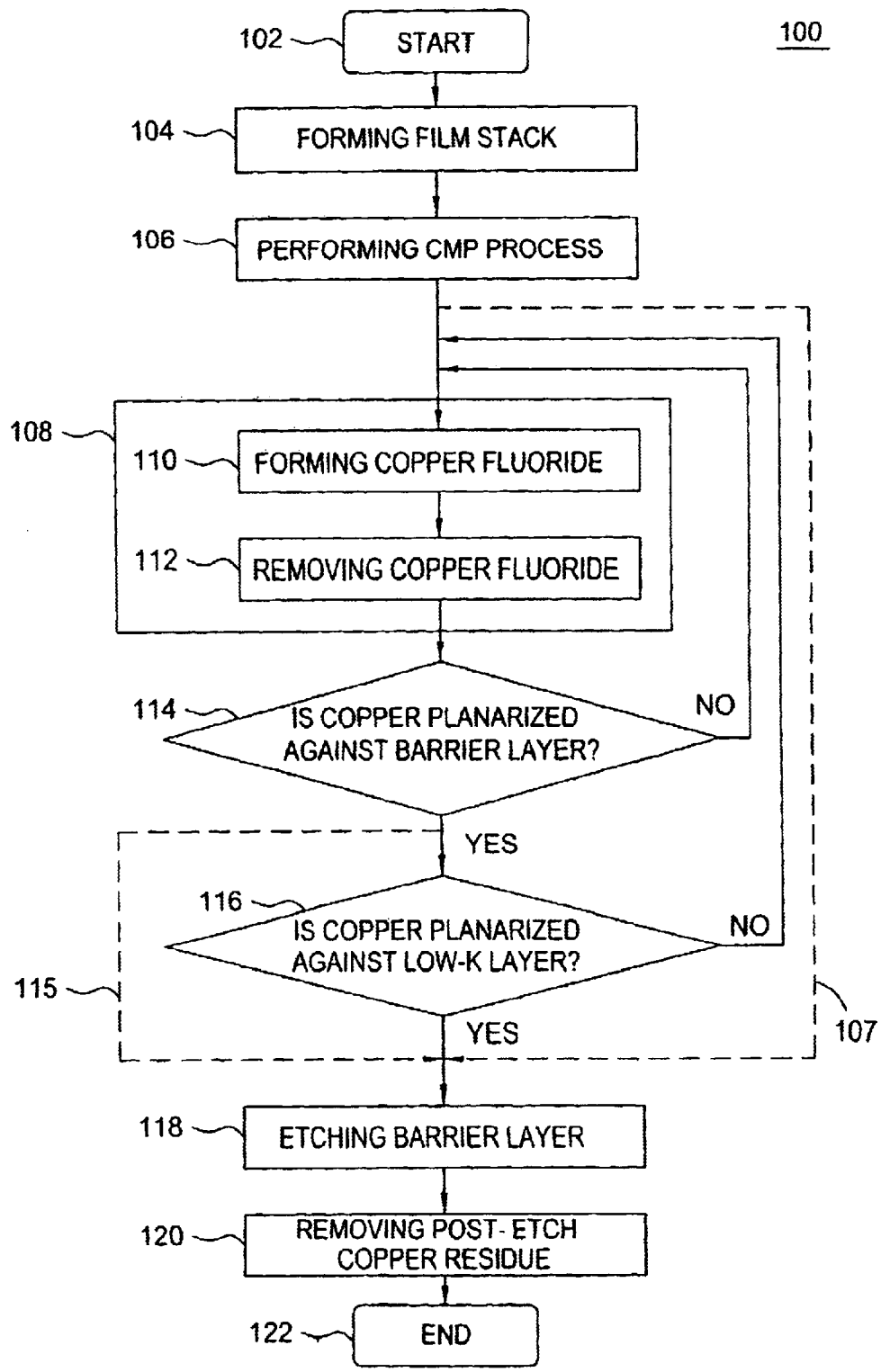
FIG. 1 depicts a flow diagram of a method of planarizing a copper interconnect structure in accordance with the present invention.
Figure 2A:
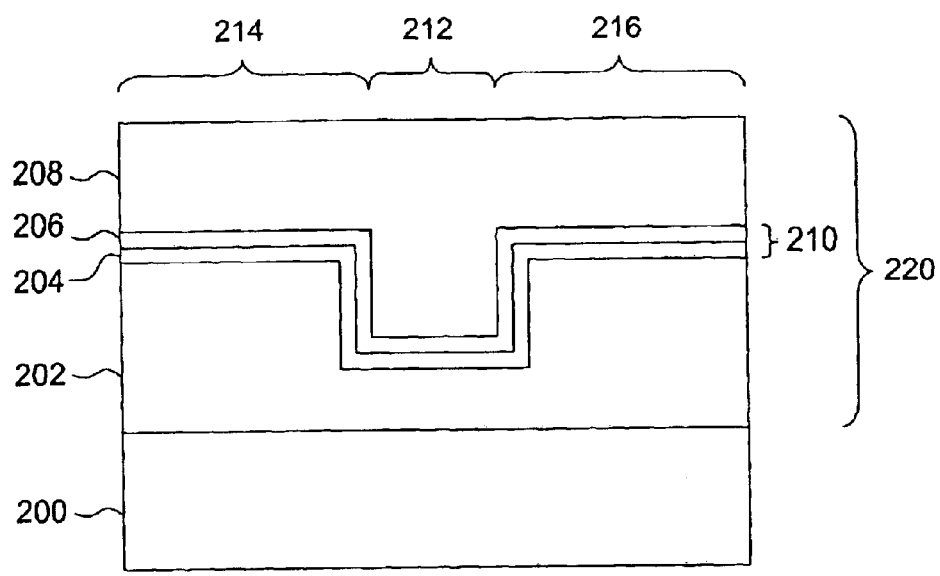
FIGS. 2A–2H, together, depict a sequence of schematic, cross-sectional views of a substrate having a copper interconnect structure being formed in accordance with the method of FIG. 1.
Figure 2B:
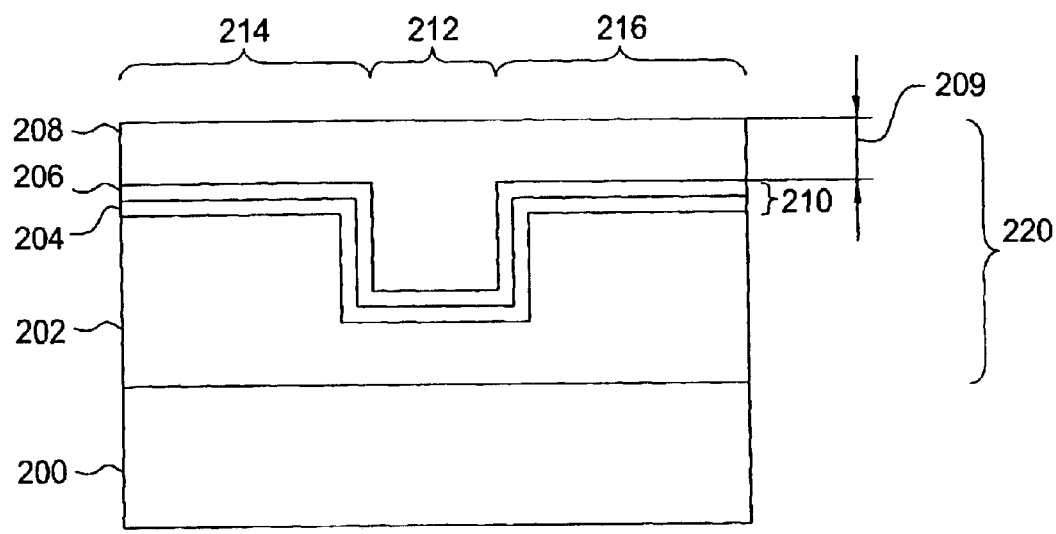
Figure 2C:
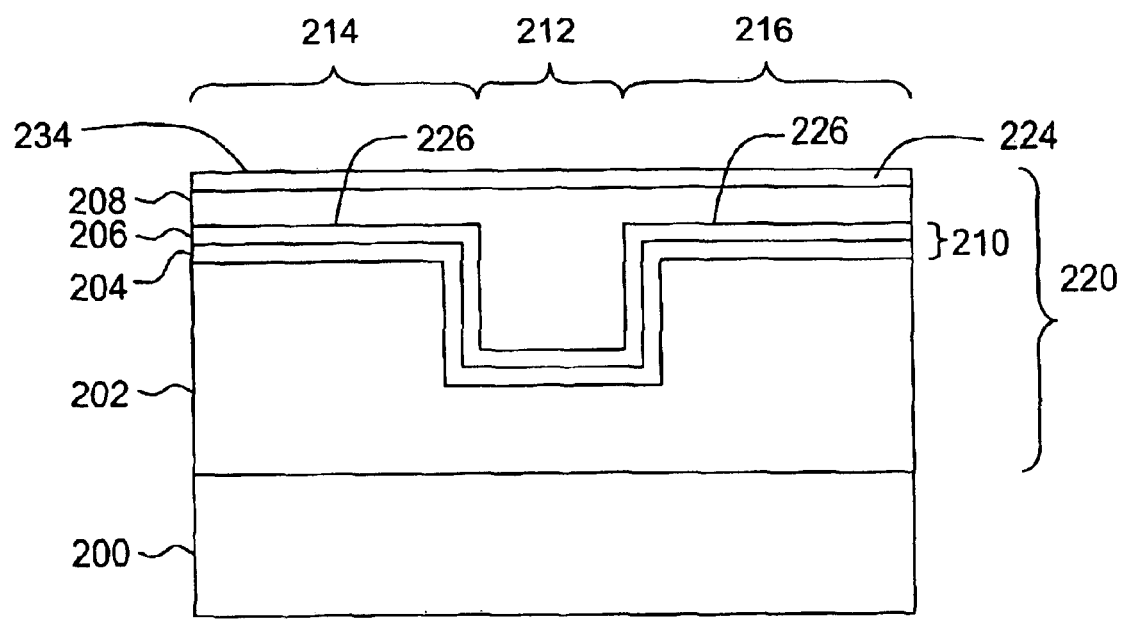
Figure 2D:
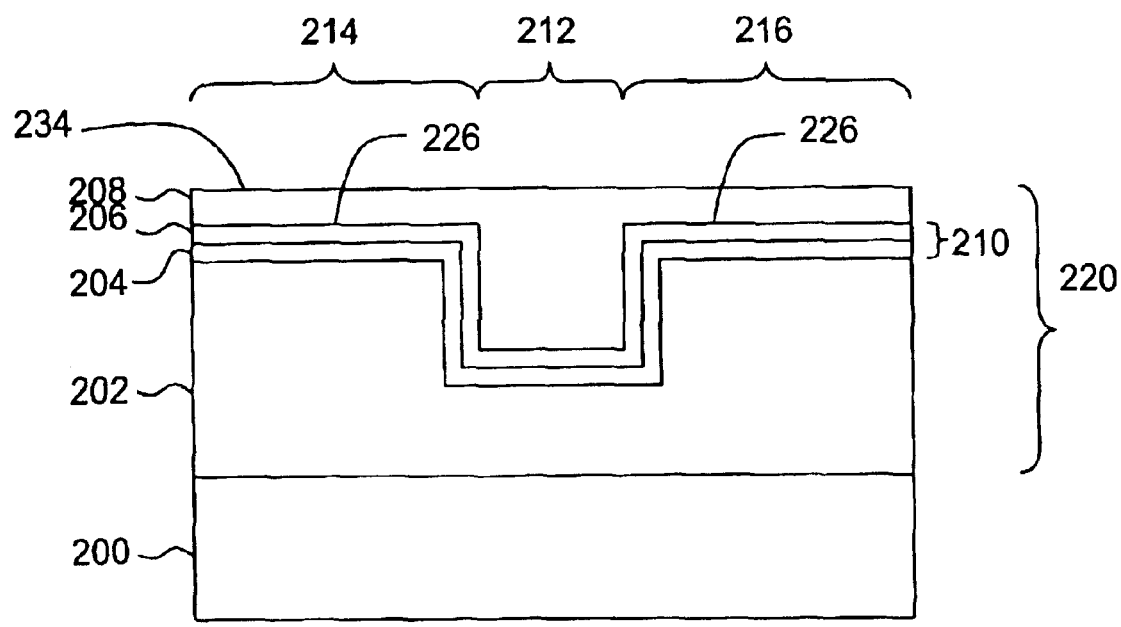
Figure 2E:
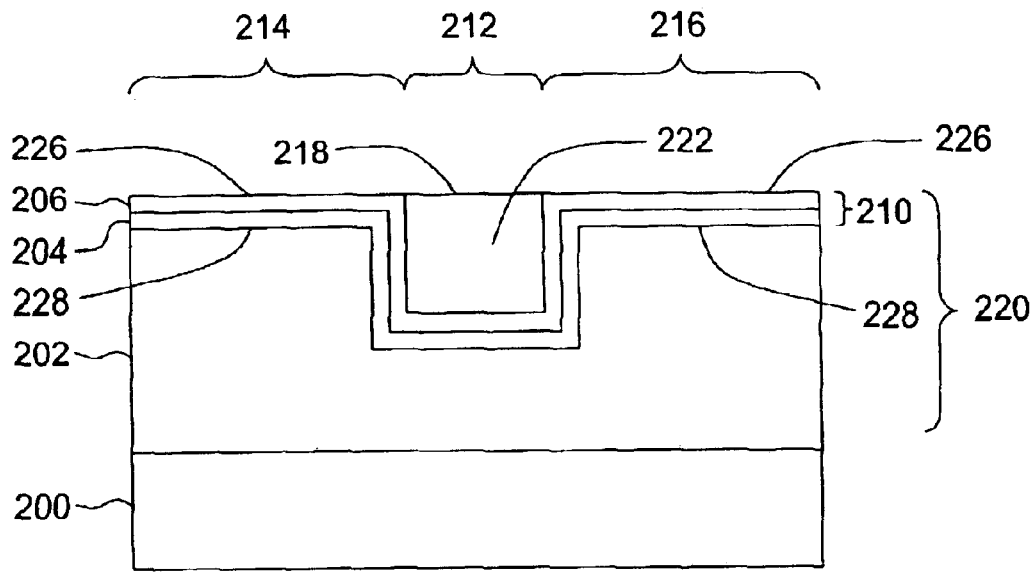
Figure 2F:
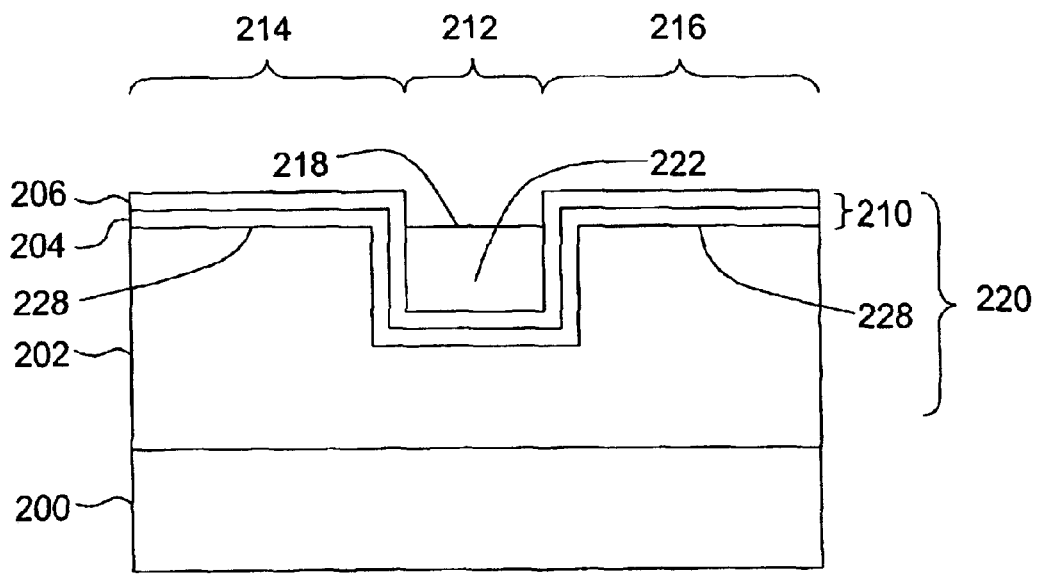
Figure 2G:
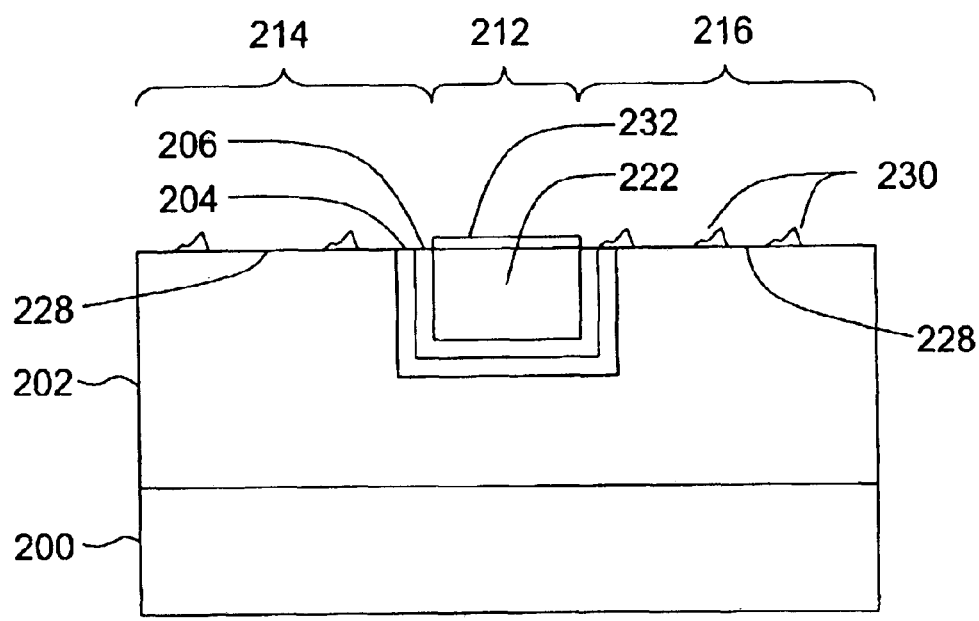
Figure 2H:
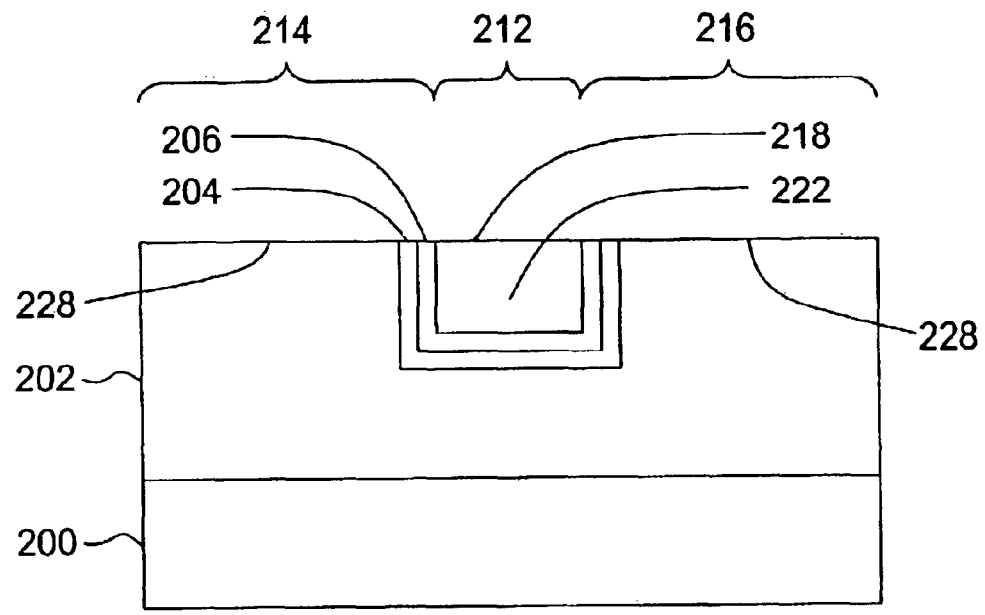

FIG. 1 depicts a flow diagram of one exemplary embodiment of the inventive method of planarizing a copper interconnect structure as a method 100, and FIGS. 2–2H, together, depict a sequence of schematic, cross-sectional views of a substrate having the copper interconnect structure being formed in accordance with the method 100.

The cross-sectional views in FIGS. 2A–2H relate to individual process steps that are used to planarize the copper interconnect structure. Sub-processes such as wafer cleaning procedures among others are well known in the art and, as such, are not shown in FIG. 1 and FIGS. 2A–2H. The images in FIGS. 2A–2H are simplified for illustrative purposes and are not depicted to scale.

Processes used to accomplish the method 100 can be performed, for example, using respective reactors of the CENTURA®, ELECTRA®, MIRRA®, and other semiconductor wafer processing systems available from Applied Materials, Inc. of Santa Clara, Calif.

The method 100 begins at step 102 and proceeds to step 104.

At step 104, a film stack 220 is formed upon a substrate 200, such as a silicon wafer. In one exemplary embodiment, the film stack 220 comprises a layer 202 of a low-K material, a barrier layer 210, and a copper layer 208. Such film stack 220 illustratively represents a wiring layer of an IC device. The wafer 200 may further comprise at least one other wiring layer, which may be considered, with respect to the film stack 220, as an underlying wiring layer, as well as other intermediate films or layers between the film stack 220 and such underlying layer (all not shown).

The layer 202 may be formed, e.g., from organic doped silicon glass (OSG), also referred to in the art as doped silicon dioxide. The OSG material is available under the trademarks BLACK DIAMOND and BLACK DIAMOND II from Applied Materials, Inc. of Santa Clara, Calif. In other embodiments, the dielectric material may comprise at least one of benzocyclobutene, parylene, polytetrafluoroethylene, polyether, polyimide, and the like. Alternatively, the layer 202 may be formed from a dielectric material having a dielectric constant greater than 4. Generally, the layer 202 is deposited to a thickness of about 2000 to 10,000 Angstroms using, for example, a vacuum deposition technique, such as chemical vapor deposition (CVD), plasma enhanced CVD, evaporation, and the like.

The barrier layer 210 illustratively comprises a film 204, formed on the dielectric layer 202, and a film 206, formed atop the layer 204. In one embodiment, the films 204 and 206 comprise, respectively, a metal (e.g., tantalum (Ta) and the like) and a nitride of such metal (e.g., tantalum nitride (TaN) and the like). Materials of the films 204 and 206 are selected such that, together, the films improve adhesion between the dielectric layer 202 and the copper layer 208, as well as protect the layer 202 during fabrication of the IC device. The films 204 and 206 are deposited (e.g., using a vacuum deposition method, such as physical vapor deposition (PVD), CVD, and the like) to a thickness of about 50 to 200 Angstroms, while a total thickness of the layer 210 is about 250 Angstroms.

The copper layer 208 is generally formed using an electroplating (ECP) metallization process. During the ECP process, as well as during other copper deposition processes, e.g., a PVD or CVD process, copper metallizes (or fills) a feature etched in the dielectric layer 202, such as, e.g., a trench 212. However, the metallization process also deposits an excess amount of the copper upon the barrier layer 210 (i.e., upon the TaN film 206). A thickness 209 of a film of excess copper in the layer 208 is generally about 5000 to 12000 Angstroms.

The ECP process can be performed, for example, using the ELECTRA® system. In other applications of the invention, the ECP process or other copper deposition process may be used to fill features such as vias, both vias and trenches simultaneously, and the like. As such, the depicted embodiment illustrates only one of many applications for the invention.

At step 106, a chemical-mechanical polishing (CMP) process is performed. The CMP process of the present invention reduces a thickness of the copper layer 208 to about 50 to 200 Angstroms. Step 106 deliberately does not remove entirely the layer 208, specifically, in the center portion of the wafer 200, to protect the dielectric layer 202 from damage during the polishing. Such CMP process may be performed using, for example, the MIRRA® system. After the CMP process, the wafer 200 is cleaned, e.g., using a conventional wet cleaning process (not shown), until any traces of the slurry and by-products of the CMP process are removed from the wafer.

At step 108, the excess amount of copper in the layer 208 (i.e., the material above a surface 226 of the TaN film 206) is removed using an atomic layer removal (ALR) process. The ALR process is a plasma process that comprises a period 110 of forming a solid layer 224 of copper fluoride (CuF) residue (FIG. 2C) and a period 112 of removing the layer 224 (FIG. 2D). Step 108 removes the film of excess copper above the surface 226 and, as such, defines a copper conductive line 222 in the trench 212 (discussed in reference to FIG. 2E). In one embodiment, step 108 also removes the copper conductive line 222 until an exposed surface 218 of the line is coplanar with a surface 228 of the dielectric layer 202.

During the period 110, a surface 234 of the layer 208 is exposed to a first plasma. The first plasma transforms an upper portion of the layer 208 into the layer 224. In one embodiment, the first plasma comprises a fluorine (F) based gas (or gas mixture). Herein the terms "gas" and "gas mixture" are used interchangeably. Specifically, the gas used in the first plasma may comprise at least one gas such as fluorocarbon $C_XF_Y$ (e.g., carbon tetrafluoride ($CF_4$)), hydrofluorocarbon $C_XF_YH_Z$ (e.g., $CHF_3$), as well as sulfur hexafluoride ($SF_6$), nitrogen trifluoride ($NF_3$), and the like. Further, the gas may also comprise a diluent gas, such as at least one of argon (Ar) and helium (He).

During the period 112, a second plasma etches and removes the copper fluoride layer 224. Specifically, during the period 112, the ALR process transforms the material of the layer 224 into volatile gaseous formations. The gaseous formations are then pump evacuated from a processing chamber of the reactor. In one embodiment, the second plasma uses a gas comprising at least one of ammonia (NH₃), nitrogen (N₂), and hydrogen (H₂). Further, similar to the period 110, the etchant gas may comprise a carrier gas, such as at least one of argon, helium, and the like.

After the period 112, the copper fluoride layer 224 is removed from the surface 234 of the copper layer 208. As such, the layer 208 becomes thinner upon completion of the period 112 than before the ALR process has started. The inventive ALR process may be cyclically repeated. Each cycle comprising the period 110 and the period 112 can reduce the thickness of the copper layer 208 by approximately 5 to 20 Angstroms.

During the period 110, a plasma reactor having an independent control of ion energy and plasma density, such as, e.g., a Decoupled Plasma Source—HT (DPS-HT) reactor, may be used to form the copper fluoride layer 224. The DPS-HT reactor is discussed in detail with respect to FIG. 3 below. In one exemplary embodiment, the DPS-HT reactor uses a 13.56 MHz inductive plasma source (source 318 in FIG. 3 below) to produce a high density plasma, while the wafer may be biased by a 13.56 MHz source (source 322 in FIG. 3 below) of bias power. The DPS-HT reactor has wide process windows for plasma source and bias power, gas chemistries, wafer temperature, and may use an endpoint detection system to determine an end of the etch process.

In one illustrative embodiment, when the DPS-HT reactor is used to for the layer 224 during the period 110, step 108 provides carbon tetrafluoride at a rate of 30 to 200 sccm and hydro-fluorocarbon CHF₃ at a rate of 30 to 200 sccm (i.e., a CF₄:CHF₃ flow ratio ranging from about 1:7 to 7:1), as well as argon (or helium) at a rate of 0 to 200 sccm. Further, step 108 applies 200 to 3000 W of plasma power and 0 W of bias power, while maintaining a wafer temperature at 200 to 350 degrees Celsius and gas pressure in the process chamber at 3 to 500 mTorr. One exemplary process provides 50 sccm of CF₄ and 50 sccm of CHF₃ (i.e., a CF₄:CHF₃ flow ratio of 1:1), 0 sccm of Ar, 600 W of plasma power, a wafer temperature of 240 degrees Celsius, and a pressure of 30 mTorr.

During the period 112, an Advanced Strip and Passivation (ASP) reactor or an AXIOM reactor of the CENTURA® system may me used to remove the copper fluoride layer 224 formed during the preceding period 110. The ASP and AXIOM reactors are available from Applied Materials, Inc. of Santa Clara, California. The ASP reactor is a microwave downstream oxygen plasma reactor in which the plasma is confined to a plasma tube and only reactive neutrals are allowed to enter a process chamber. Such a plasma confinement scheme precludes plasma-related damage of the substrate or circuits formed on the substrate. In the ASP reactor, a wafer backside may be heated radiantly by quartz halogen lamps or cooled using the backside gas such that the wafer temperature can be maintained at 200 to 400 degrees Celsius. Similar to the referred to above DPS-HT reactor, the ASP reactor may use an endpoint detection system.

In this illustrative embodiment, using the ASP reactor to remove the copper fluoride layer 224 during the period 112, step 108 provides ammonia at a rate of 50 to 5000 sccm, nitrogen at a rate of 0 to 5000 sccm, and hydrogen at a rate of 0 to 5000 sccm, as well as argon (or helium) at a rate of 0 to 5000 sccm. Further, step 108 applies 500 to 2500 W of microwave power and maintains a wafer temperature at 200 to 400 degrees Celsius and gas pressure in the process chamber at 200 to 4000 mTorr. One exemplary process provides 1000 sccm of NH₃ and 1000 sccm of N₂ (i.e., a NH₃:N₂ flow ratio of 1:1, 50 sccm of Ar, 1200 W of plasma power, 0 W of bias power, a wafer temperature of 300 degrees Celsius, and a pressure of 2000 mTorr. This recipe accomplishes selectivity to CuF over the TaN of about 100:1.

At step 114, the method 100 queries whether the copper has been removed from the upper film 206 (e.g., a TaN film) of the barrier layer 210 above the surface 207 (i.e., in the regions 214 and 216). In one embodiment, the film 206 is used as an etch stop layer during the ALR process. In a computerized etch reactor, such as the exemplary ASP reactor, at step 114, the decision making routine may be automated using an end-point detection technique. For example, the endpoint detection system of the ASP reactor may monitor plasma emissions at a particular wavelength to determine that the copper has been removed in the regions 214, 216.

If the query of step 114 is negatively answered, the method 100 proceeds to step 108 to continue the ALR process. As such, the ALR process performs a plurality of cycles of forming the copper fluoride layer 224 (period 110) and etching the copper fluoride (period 112). Such cycles, together, result in removing the excess copper and forming the copper conductive line 222 having the surface 218 that is substantially coplanar with the surface 226 of the TaN layer 206 (FIG. 2E). If the query of step 114 is affirmatively answered, the method 100 proceeds to step 116.

At step 116, the method 100 queries whether the copper conductive line 222 has been further etched such that the surface 218 is located, in the region 212, substantially in the same plane with the surface 228 of the dielectric layer 202 (FIG. 2F).

If the query of step 116 is negatively answered, the method 100 proceeds to step 108 to continue the cyclical ALR process. In one embodiment, the ALR process may continue for a specific time or for a specific number of cycles, as defined by the etch rate of the copper conductive line 222.

If the query of step 116 is affirmatively answered, the method 100 proceeds to step 118. In certain applications when it is sufficient to planarize the copper layer 208 against the surface 226, step 116 may be considered optional, as illustratively shown in FIG. 1 using a dashed link 115.

At step 118, the barrier layer 210 is plasma etched and removed in the regions 214 and 216. In one embodiment, step 118 uses the dielectric layer 202 (e.g., an OSG layer) as an etch stop layer.

Step 118 can be accomplished, for example, in the DSP-HT reactor. In one illustrative embodiment, step 118 provides carbon tetrafluoride at a rate of 30 to 200 sccm and hydro-fluorocarbon (CHF₃) at a rate of 30 to 200 sccm (i.e., a CF₄:CHF₃ flow ratio ranging from about 1:7 to 7:1), as well as argon (or helium) at a rate of 0 to 200 sccm. Step 118 also applies 200 to 3000 W of plasma power and 0 W of bias power, while maintaining a wafer temperature at 200 to 400 degrees Celsius and gas pressure in the process chamber at 3 to 100 mTorr.

One exemplary process provides 50 sccm of CF₄ and 50 sccm of CHF₃ (i.e., a CF₄:CHF₃ flow ratio of 1:1), 0 sccm of Ar, 600 W of plasma power, a wafer temperature of 240 degrees Celsius, and a pressure of 30 mTorr. Such recipe provides selectivity to Ta/TaN over the BLACK DIAMOND or BLACK DIAMOND II layer 202 of about 2:1.

Similar to the period 110 of the ALR process, step 118 develops a residue-like film 232. The film 232 comprises copper fluoride or copper chloride, when step 118 uses the fluorine or chlorine based chemistry, respectively. The film 232 may comprise both CuF when a combination of the chemistries is used to etch the barrier layer. Additionally, step 118 deposits on the surface 228 residue 230 having chemical composition close to that of the layer 232 (FIG. 2G.) Both the film 232 and the residue 230 should be removed before fabrication of the IC device may continue.

At step 120, the post-etch plasma cleaning process is performed (FIG. 2H). Step 120 removes the film 232 and residue 230 using, similar to the period 112, a gas comprising at least one of ammonia, nitrogen, and hydrogen, as well as a carrier gas such as at least one of argon, helium, and the like. When the plasma comprises nitrogen, step 120 also passivates the surface 218 to protect the copper conductive line 222 from corrosion. The cleaning process can be performed, for example, in the ASP reactor.

When the post-etch cleaning process is performed in the ASP reactor, step 120 and the period 112 may use similar process recipes. For example, in one illustrative embodiment, step 120 provides ammonia at a rate of 50 to 5000 sccm, nitrogen at a rate of 0 to 5000 sccm, and hydrogen at a rate of 0 to 5000 sccm , as well as argon (or helium) at a rate of 0 to 5000 sccm. In this embodiment, step 108 applies 500 to 2500 W of microwave power and maintains a wafer temperature at 200 to 400 degrees Celsius and gas pressure in the process chamber at 200 to 4000 mTorr. To remove the layer 232 and residue 230, one exemplary process provides 1000 sccm of $NH_3$ and 1000 sccm of $N_2$ (i.e., a $NH_3:N_2$ flow ratio of 1:1), 0 sccm of Ar, 1200 W of plasma power, 0 W of bias power, a wafer temperature of 300 degrees Celsius, and a pressure of 2000 mTorr.

In yet another alternative embodiment, the CMP process of step 106 may continue until the copper layer 208 is removed from the wafer 200. In this embodiment, the barrier layer 210 may partially be removed in the center portion of the wafer 200, but still remain in the portion near the edge of the wafer 200, as discussed above in reference to the post-CMP concave cross-sectional pattern of the wafer. In this embodiment, to planarize the copper interconnect structure, the method 100 skips steps 108, 114, and 116, as illustratively shown in FIG. 1 using a dashed link 107.

At step 122, the method 100 ends.

Figure 3:
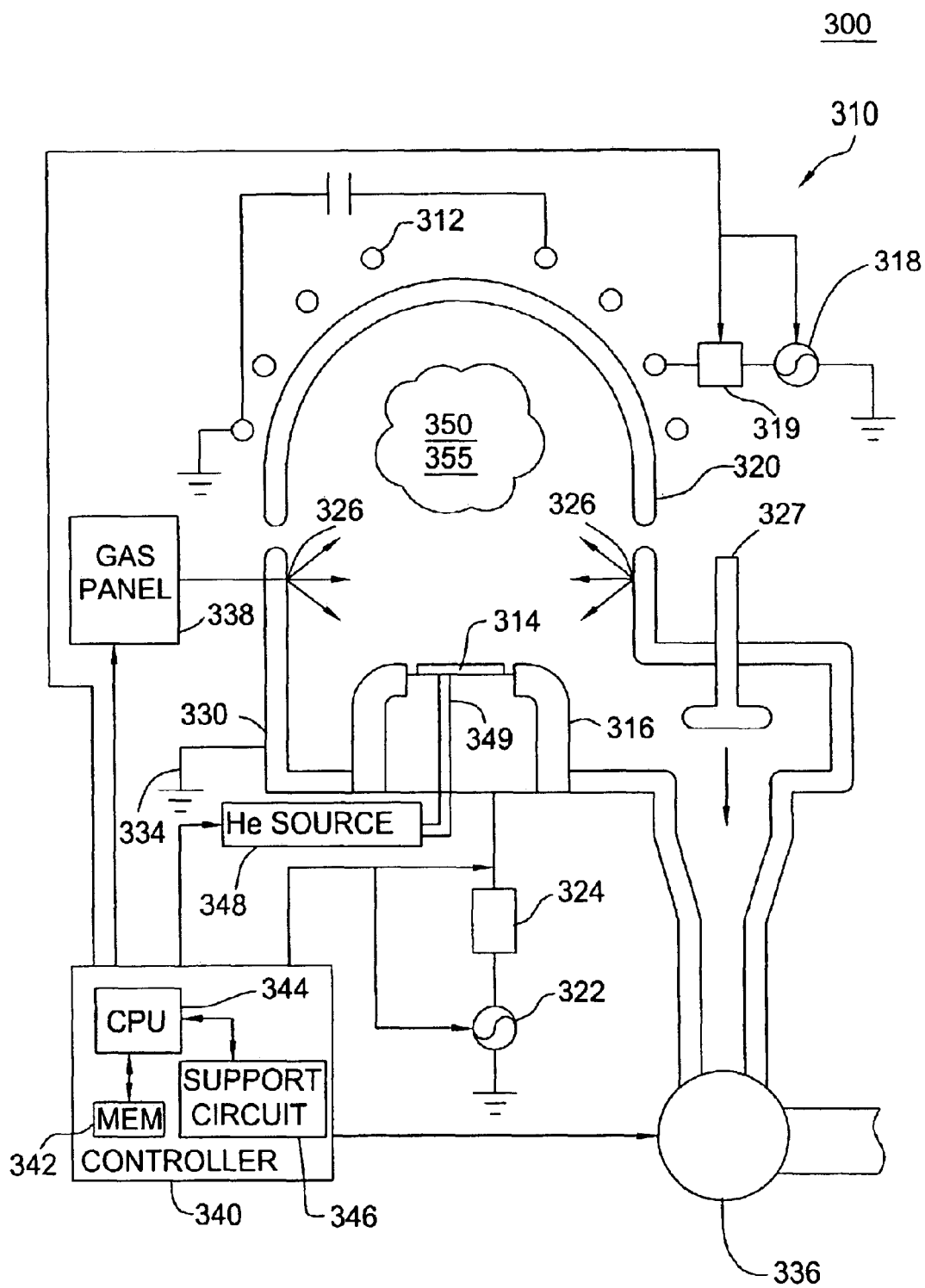
FIG. 3 depicts a schematic diagram of a plasma processing apparatus of the kind used in performing portions of the method of FIG. 1.

FIG. 3 depicts a schematic diagram of the DPS-HT reactor 300 that may be used to accomplish portions of the ALR process of the present invention. The reactor 300 comprises a process chamber 310 having a wafer support pedestal 316 within a conductive body (wall) 330, and a controller 340.

The support pedestal (cathode) 316 is coupled, through a first matching network 324, to a biasing power source 322. The source 322 generally is capable of producing up to 300 W of continuous and pulsed power at a tunable frequency in a range from 50 kHz to 13.56 MHz. In other embodiments, the source 322 may be a DC or pulsed DC source. The wall 330 is supplied with a dome-shaped dielectric ceiling 320. Other modifications of the chamber 310 may have other types of ceilings, e.g., a substantially flat ceiling. Typically, the wall 330 is coupled to an electrical ground 334. Above the ceiling 320 is disposed an inductive coil antenna 312. The antenna 312 is coupled, through a second matching network 319, to a plasma power source 318. The source 318 typically is capable of producing up to 3000 W at a, tunable frequency in a range from 50 kHz to 13.56 MHz.

A controller 340 comprises a central processing unit (CPU) 344, a memory 342, and support circuits 346 for the CPU 344 and facilitates control of the components of the process chamber 310 and, as such, of the etch process, as discussed below in further detail.

In operation, a semiconductor wafer 314 is placed on the pedestal 316 and process gases are supplied from a gas panel 338 through entry ports 326 and form a gaseous mixture 350. The gaseous mixture 350 is ignited into a plasma 355 in the chamber 310 by applying power from the sources 318 and 322 to the antenna 312 and the cathode 316, respectively. The pressure within the interior of the chamber 310 is controlled using a throttle valve 327 and a vacuum pump 336. The temperature of the chamber wall 330 is controlled using liquid-containing conduits (not shown) that run through the wall 330.

The temperature of the wafer 314 is controlled by stabilizing a temperature of the support pedestal 316. In one embodiment, the helium gas from a source 348 is provided via a gas conduit 349 to channels formed by the back of the wafer 314 and grooves (not shown) on the pedestal surface. The helium gas is used to facilitate heat transfer between the pedestal 316 and the wafer 314. During the processing, the pedestal 316 may be heated by a resistive heater (not shown) within the pedestal to a steady state temperature and then the helium gas facilitates uniform heating of the wafer 314. Using thermal control, the wafer 314 is maintained at a temperature of between 10 and 500 degrees Celsius.

Those skilled in the art will understand that other forms of etch chambers may be used to practice the invention, including chambers with remote plasma sources, microwave plasma chambers, electron cyclotron resonance (ECR) plasma chambers, and the like.

To facilitate control of the chamber as described above, the controller 340 may be one of any form of general purpose computer processor that can be used in an industrial setting for controlling various chambers and sub-processors. The memory 342 is coupled to the CPU 344. The memory 342, or computer-readable medium, may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like.

Software routines that, when executed by the CPU 344, cause the reactor to perform processes of the present invention, are generally stored in the memory 342. The software routines may also be stored and/or executed by a second CPU (not shown) that is remotely located from the hardware being controlled by the CPU 344.

The software routines are executed after the wafer 314 is positioned on the pedestal 316. The software routines, when executed by the CPU 344, transform the general purpose computer into a specific purpose computer (controller) 340 that controls the chamber operation such that the etching process is performed in accordance with the method of the present invention.

Although the present invention is discussed as being implemented as a software routine, some of the method steps that are disclosed herein may be performed in hardware as well as by the software controller. As such, the invention may be implemented in software as executed upon a computer system, in hardware as an application specific integrated circuit (ASIC), or other type of hardware implementation, or a combination of software and hardware.

Figure 4:
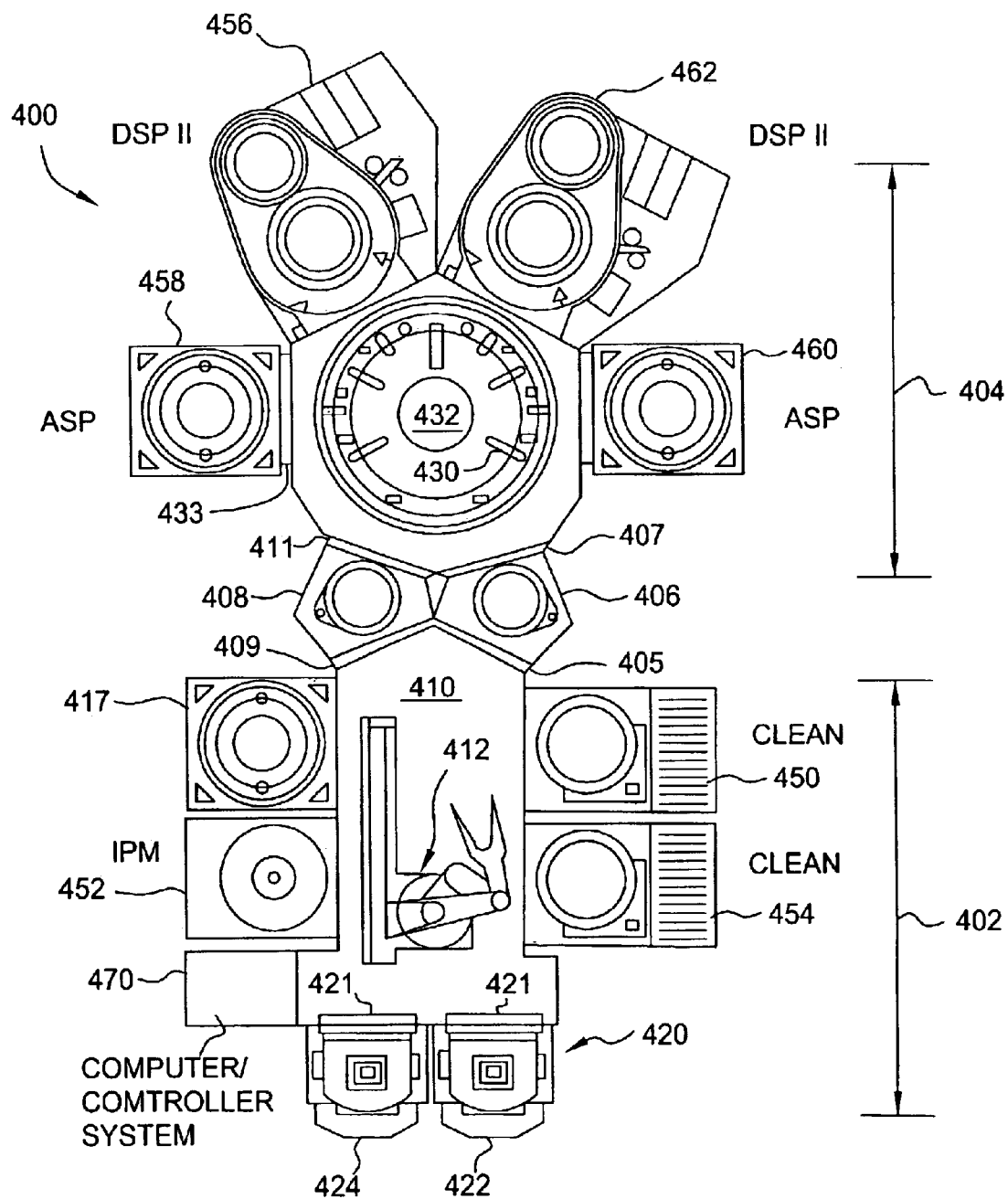
FIG. 4 depicts a schematic, plan view of a processing platform used to perform the method of the present invention.

The processes of the present invention may be illustratively performed using a processing platform 400 shown in FIG. 4 that comprises reactors for performing both atmospheric and sub-atmospheric processes. The platform 400 and the various modules and tools that can be used with such a platform are described in detail in U.S. patent application Ser. No. 09/945,454, filed Aug. 31, 2001, which is herein incorporated by reference. The salient features of the processing platform 400 are briefly described below.

Depending upon the process modules that are used in the platform 400, the platform 400 (also referred to as a process tool) can be used to perform etching, oxidation, substrate cleaning, photoresist stripping, substrate inspection and the like. The platform 400 comprises an atmospheric platform 402 and a sub-atmospheric platform 404. The sub-atmospheric platform 404 and the atmospheric platform 402 may be coupled together by a single substrate load lock 406 or, as shown in the depicted example, are coupled together by a pair of single load locks 406 and 408. In some applications, the sub-atmospheric and atmospheric platforms 404 and 402 are not coupled together and may be used separately. In one configuration, the stand-alone platform 402 may contain photoresist stripping reactors and wet cleaning modules that perform post-etch processing.

The atmospheric platform 402 comprises a central atmospheric transfer chamber 410 containing a substrate handling device 412, such as a robot. Directly attached to the atmospheric transfer chamber 410 is a substrate wet cleaning module 450, an integrated particle monitor 452 and a critical dimension (CD) measuring tool 454, and a photoresist stripping chamber 417. A dry clean module (not shown) can also be attached to the atmospheric transfer chamber 410, if desired. Each module or tool is coupled to the transfer chamber 410 by a separately closable and sealable opening, such as a slit valve. The transfer chamber is maintained at substantially atmospheric pressure during operation. The substrate handling device 412 is able to transfer substrates from one module or tool to another module or tool that is attached to the atmospheric transfer chamber 410. In the embodiment shown, the substrate handling device 412 is a dual blade, single arm, single wrist robot. Other types of robots may be used to access the various modules and tools.

The atmospheric transfer chamber 410 is coupled to at least one substrate input/output module 420 that provides and receives substrates to and from the platform 400. In one embodiment of the platform 400, the module 420 comprises at least one front opening unified pod (FOUP). Two FOUPs 422 and 424 are depicted. The substrate handling device 412 accesses each FOUP through a sealable access door 421. The substrate handling device 412 moves linearly along a track 423 to facilitate access to all of the modules and tools.

The atmospheric transfer chamber 410 is coupled to the pair of load locks 406 and 408 through sealable doors 405 and 409 such that the substrate handling device 412 can access the load locks 406 and 408. The sub-atmospheric platform 404 comprises a central sub-atmospheric transfer chamber 430 and a plurality of process chambers 456, 458, 460, and 462. Sealable doors 407 and 411 respectively couple each load lock 406 and 408 to the sub-atmospheric transfer chamber 430. The sub-atmospheric transfer chamber 430 contains a substrate handing device 432, such as a robot (not shown), that accesses the load locks 406 and 408 as well as the process chambers 456, 458, 460 and 462. The process chambers 456, 458, 460 and 462 are each coupled to the sub-atmospheric transfer chamber 430 via separately closable and sealable openings, such as slit-valves. The process chambers 456, 458, 460 and 462 may comprise one or more etching chambers such as the DPS or DPS II chamber. Additionally, one or more photoresist stripping chambers such as the ASP chamber described above may be used as one or more of the process chambers 456, 458, 460 and 462. As also described above, the ASP reactor or AXIOM reactor, if used, may be located either on the sub-atmospheric platform 404 or the atmospheric platform 402. FIG. 4 shows the sub-atmospheric platform 404 comprising two DPS II chambers 456 and 462 and two ASP chambers 458 and 460. The sub-atmospheric platform 404 is, for example, a CENTURA® platform available from Applied Materials, Inc. of Santa Clara, Calif.

The platform 400 also includes a system computer 470 that is coupled to and controls each module that is coupled to the atmospheric and sub-atmospheric platforms 402 and 404, controls the substrate handling devices 412 and 432, and controls the load locks 406 and 408. Generally, the system computer 470 controls all aspects of operation of the platform 400 either by direct control of the sub-systems, modules, tools and apparatus or by controlling the computers associated with those sub-systems, modules, tools and apparatus. The system computer 470 enables feedback from one module or tool to be used to control the flow of substrates through the platform 400 and/or control the processes or operation of the various modules and tools to optimize substrate throughput.

Although the forgoing discussion referred to planarizing copper interconnect structure, fabrication of other structures and features used in the integrated electronic circuits and devices can benefit from the invention.

The invention can be practiced in other semiconductor processing systems wherein the processing parameters may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. A method for planarizing a copper interconnect structure, comprising:
   applying a plurality of plasma processing cycles to the copper interconnect structure, wherein each plasma processing cycle comprises a period of exposing a portion of copper comprising the copper interconnect structure to a gas that forms a film of copper fluoride on the exposed copper portion and a period of removing the film of copper fluoride.

2. The method of claim 1, further comprising:
   (a) repeating the plasma processing cycles until a barrier layer beneath the copper is exposed, said barrier layer including a film of a metal and a film of a nitride of the metal;
   (b) etching the barrier layer; and
   (c) removing post-etch residue.

3. The method of claim 2, wherein the copper is disposed on formed upon a dielectric layer comprising at least one of an organic doped silicon glass, benzocyclobutene, parylene, polytetrafluoroethylene, polyether, and polyimide.

4. The method of claim 1, wherein the period of forming the film of copper fluoride performs a plasma process that uses a gas comprising at least one of a fluorocarbon gas having a chemical structure $C_XF_Y$ (where x and y are integers), a hydro-fluorocarbon gas having a chemical structure $C_XF_YH_Z$ (where x, y, and z are integers), $SF_6$ and $NF_3$.

5. The method of claim 4, wherein the gas comprises $CF_4$ and $CHF_3$.

6. The method of claim 5, wherein the period of forming the film of copper fluoride further comprises:

providing 30 to 200 sccm of $CF_4$, 30 to 200 sccm of $CHF_3$, 0 to 200 sccm of Ar to a total pressure of about 3 to 500 mTorr;

applying about 200 to 3000 W of plasma power; and maintaining a substrate temperature of about 200 to 400 degrees Celsius.

7. The method of claim 1, wherein the period of etching the film of copper fluoride performs a plasma process that uses a gas comprising at least one of $NH_3$, $N_2$, and $H_2$.

8. The method of claim 7, wherein the period of etching the film of copper fluoride further comprises:

providing of 50 to 5000 sccm of $NH_3$, 0 to 5000 sccm of $N_2$, 0 to 5000 sccm of $H_2$, 0 to 5000 sccm of Ar to a total pressure of about 200 to 4000 mTorr, applying about 500 to 2500 W of microwave power, and maintaining a substrate temperature of about 200 to 400 degrees Celsius.

9. The method of claim 2, wherein step (a) cyclically performs a fir plasma process that uses a fit gas comprising at least one of a fluorocarbon gas having a chemical structure $C_XF_Y$ (where x and y are integers), a hydro-fluorocarbon gas having a chemical structure $C_XF_YH_Z$ (where x, y, and z are integers), $SF_6$, and $NF_3$ and a second plasma process that uses a second gas comprising at least one of $NH_3$, $N_2$, and $H_2$.

10. The method of claim 9, wherein the first gas comprises $CF_4$ and $CHF_3$.

11. The method of claim 10, further comprising:

providing 30 to 200 sccm of $CF_4$, 30 to 200 scorn of $CHF_3$, 0 to 200 sccm of Ar to a total pressure of about 3 to 100 mTorr;

applying about 200 to 3000 W of plasma power; and maintaining a substrate temperature of about 200 to 400 degrees Celsius.

12. The method of claim 2, wherein step (b) performs a plasma process that uses a gas comprising $CF_4$ and $CHF_3$ at a flow rate ratio $CF_4$; $CHF_3$, in a range from 1:7 to 7:1.

13. The method of claim 12, wherein the gas further comprises at least one of Ar or Ha.

14. The method of claim 2, wherein the step (c) performs a plasma process that uses a gas comprising at least one of $NH_3$, $N_2$, and $H_2$.

15. The method of claim 14 further comprising:

providing of 50 to 5000 sccm of $NH_3$, 0 to 5000 sccm of $N_2$; 0 to 5000 sccm of $H_2$, 0 to 5000 sccm of Ar to a total pressure of about 200 to 4000 mTorr;

applying about 500 to 2500 W of microwave power; and maintaining a substrate temperature of about 200 to 400 degrees Celsius.

16. A computer-readable medium containing software that, when executed by a computer, causes a semiconductor substrate processing system to planarize a copper interconnect structure using a method comprising:

applying a plurality of plasma processing cycles to the copper interconnect structure, wherein each plasma processing cycle comprises a period of exposing a copper layer to a gas forming a film of copper fluoride on said layer and a period of removing the film of copper fluoride.

17. The computer-readable medium of claim 16, further comprising:

(a) repeating the plasma processing cycles until a barrier layer beneath the copper layer is exposed, said barrier layer including a film of a metal and a film of a nitride of the metal;

(b) etching the barrier layer; and (c) removing post-etch residue.

18. The computer-readable medium of claim 17, wherein the copper layer is formed upon a dielectric layer comprising at least one of an organic doped silicon glass, benzocyclobutene, parylene, polytetrafluoroethylene, polyether, and polyimide or formed upon the barrier layer disposed over said dielectric layer.

19. The computer-readable medium of claim 16, wherein the period of forming the film of copper fluoride performs a plasma process that uses a gas comprising at least one of a fluorocarbon gas having a chemical structure $C_XF_Y$ (where x and y are integers), a hydro-fluorocarbon gas having a chemical structure $C_XF_YH_Z$ (where x, y, and z are integers), $SF_6$ and $NF_3$.

20. A method for planarizing a copper interconnect structure, comprising:

applying a plurality of plasma processing cycles to the copper interconnect structure, each plasma processing cycle including:

a period of exposing a copper layer to a plasma comprising at least one of a fluorocarbon gas having a chemical structure $C_XF_Y$ (where x and y are integers), a hydro-fluorocarbon gas having a chemical structure $C_XF_YH_Z$ (where x, y, and z are integers), $SF_6$ and $NF_3$ to form a film of copper fluoride upon said layer of copper; and a period of removing the film of copper fluoride using a plasma comprising at least one of $NH_3$, $N_2$, and $H_2$.

21. The method of claim 2, wherein the copper is formed upon the barrier layer disposed over said dielectric layer.

* * * * *

UNITED STATES PATENT AND TRADEMARK OFFICE
CERTIFICATE OF CORRECTION

PATENT NO. : 6,784,107 B1  Page 1 of 1
DATED : August 31, 2004
INVENTOR(S) : Chen et al.

It is certified that error appears in the above-identified patent and that said Letters Patent is hereby corrected as shown below:

Column 11,
Line 19, change "fir" to -- first -- both occurrence
Line 40, change "Ha" to -- He --.
Line 47, change "$N_2;0$" to -- $N_2$, 0 --

Signed and Sealed this

Nineteenth Day of April, 2005

JON W. DUDAS
*Director of the United States Patent and Trademark Office*